(12) United States Patent
Lazzarino

(10) Patent No.: US 10,593,549 B2
(45) Date of Patent: Mar. 17, 2020

(54) METHOD FOR DEFINING PATTERNS FOR CONDUCTIVE PATHS IN A DIELECTRIC LAYER

(71) Applicant: IMEC VZW, Leuven (BE)

(72) Inventor: Frederic Lazzarino, Hamme-Mille (BE)

(73) Assignee: Imec vzw, Leuven (BE)

( * ) Notice: Subject to any disclaimer, the term of this patent is extended or adjusted under 35 U.S.C. 154(b) by 0 days.

(21) Appl. No.: 15/906,149

(22) Filed: Feb. 27, 2018

(65) Prior Publication Data

US 2018/0247814 A1    Aug. 30, 2018

(30) Foreign Application Priority Data

Feb. 27, 2017  (EP) ..................................... 17158033

(51) Int. Cl.
| | |
|---|---|
| *H01L 21/311* | (2006.01) |
| *H01L 21/027* | (2006.01) |
| *H01L 21/033* | (2006.01) |
| *H01L 21/3213* | (2006.01) |
| *H01L 21/768* | (2006.01) |

(52) U.S. Cl.
CPC ...... *H01L 21/0337* (2013.01); *H01L 21/0273* (2013.01); *H01L 21/0332* (2013.01); *H01L 21/31116* (2013.01); *H01L 21/31127* (2013.01); *H01L 21/31144* (2013.01); *H01L 21/76802* (2013.01); *H01L 21/76816* (2013.01); *H01L 21/76877* (2013.01)

(58) Field of Classification Search
CPC ........... H01L 21/0337; H01L 21/31144; H01L 21/31116; H01L 21/31127; H01L 21/0332; H01L 21/76802; H01L 21/0273; H01L 21/0334
See application file for complete search history.

(56) References Cited

U.S. PATENT DOCUMENTS

| | | | |
|---|---|---|---|
| 8,232,210 B2 * | 7/2012 | Cheng ................. | H01L 21/0337 257/E21.219 |
| 8,889,560 B2 * | 11/2014 | Chung ................ | H01L 21/0337 438/702 |
| 9,773,700 B1 * | 9/2017 | Burns ............... | H01L 21/76897 |
| 9,865,473 B1 * | 1/2018 | Ogino ............... | H01L 21/02164 |
| 9,881,794 B1 * | 1/2018 | Su ....................... | H01L 21/0332 |
| 9,905,424 B1 * | 2/2018 | Law .................... | H01L 21/0338 |

(Continued)

*Primary Examiner* — Zandra V Smith
*Assistant Examiner* — Jeremy J Joy
(74) *Attorney, Agent, or Firm* — McDonnell Boehnen Hulbert & Berghoff LLP

(57) ABSTRACT

An example embodiment may include a method for defining patterns for conductive paths in a dielectric layer. The method may include (a) forming a mask layer on the dielectric layer, (b) forming on the mask layer a set of longitudinally and parallel extending mask features, each mask feature including a mandrel having a pair of side wall spacers, the mask features being spaced apart such that gaps are formed between the mask features, (c) depositing an organic spin-on layer covering the set of mask features and filling the gaps, (d) etching a first trench in the organic spin-on layer, the first trench extending across at least a subset of the gaps and exposing the mask layer, and (e) depositing in a spin-on process a planarization layer covering the organic spin-on layer and filling the first trench.

9 Claims, 9 Drawing Sheets

(56) References Cited

U.S. PATENT DOCUMENTS

| | | | |
|---|---|---|---|
| 9,941,164 B1* | 4/2018 | Kim | H01L 21/76897 |
| 9,966,338 B1* | 5/2018 | Zhang | H01L 21/76883 |
| 10,002,786 B1* | 6/2018 | Licausi | H01L 23/53242 |
| 10,083,858 B2* | 9/2018 | Licausi | H01L 23/5283 |
| 2014/0170853 A1* | 6/2014 | Shamma | H01L 21/02115 |
| | | | 438/699 |
| 2014/0273446 A1* | 9/2014 | Huang | H01L 21/76816 |
| | | | 438/669 |
| 2015/0056800 A1* | 2/2015 | Mebarki | H01L 21/76885 |
| | | | 438/652 |
| 2015/0155171 A1* | 6/2015 | Chang | H01L 21/0338 |
| | | | 438/703 |
| 2017/0062271 A1* | 3/2017 | Brink | H01L 21/76802 |
| 2018/0247862 A1* | 8/2018 | Lazzarino | H01L 21/76816 |

* cited by examiner

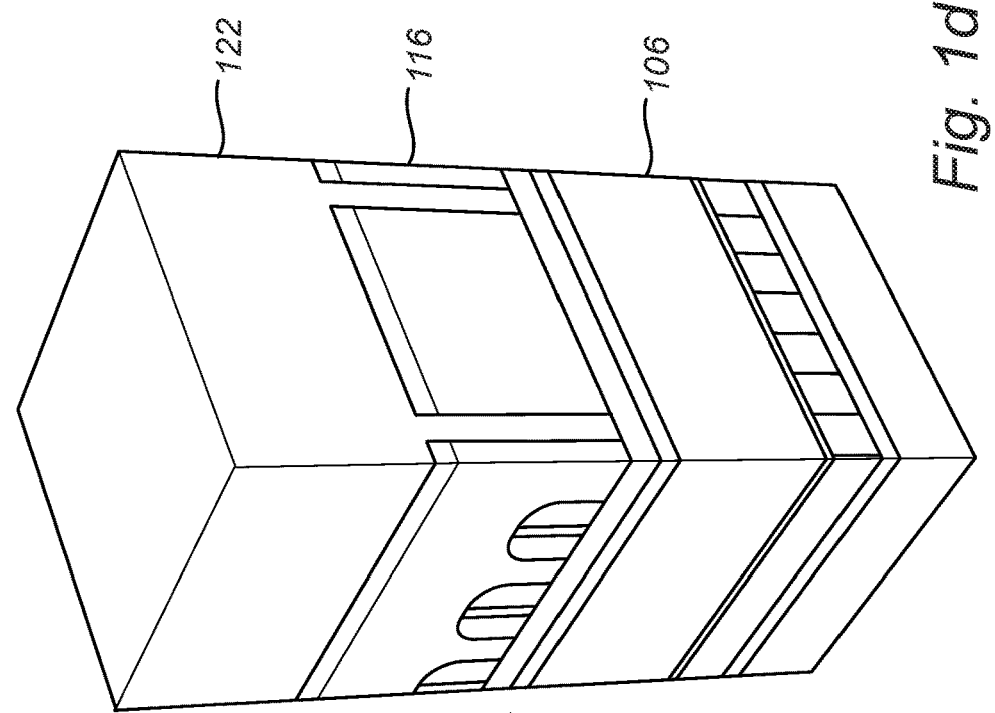
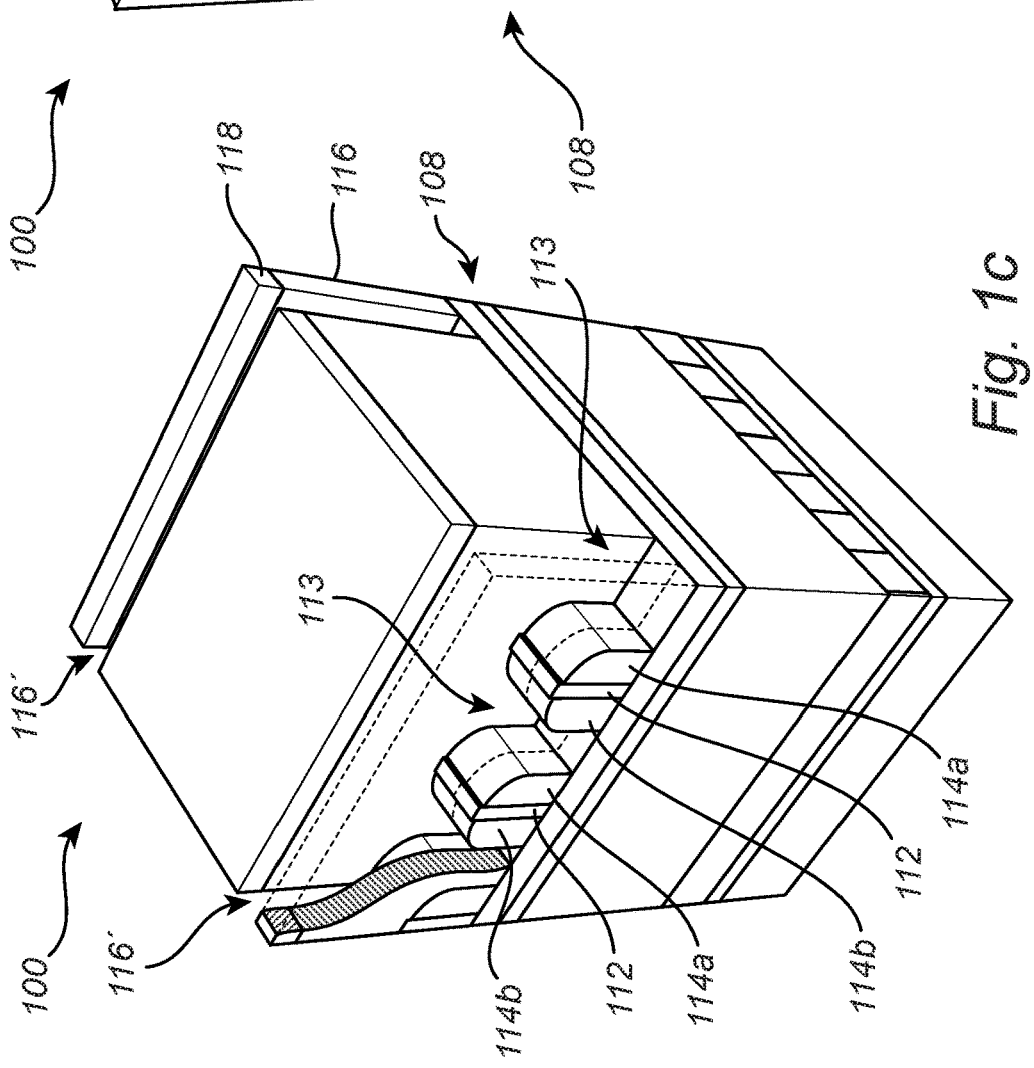
Fig. 1d
Fig. 1c

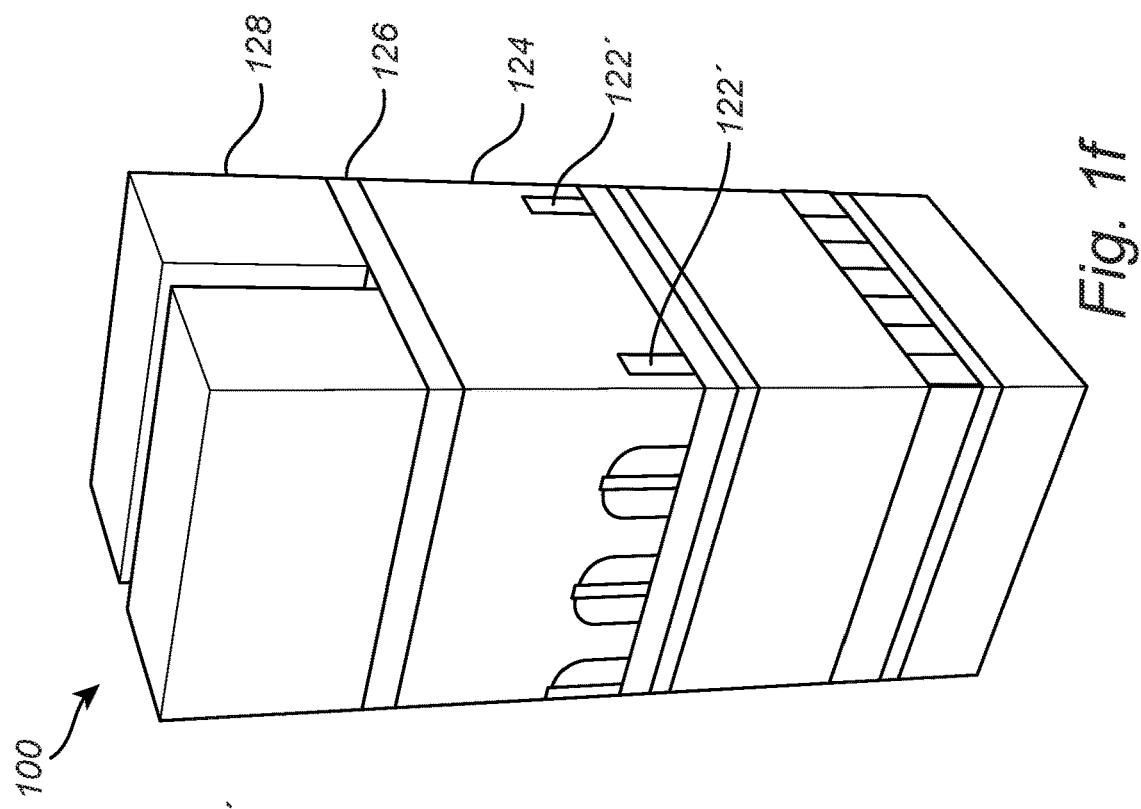
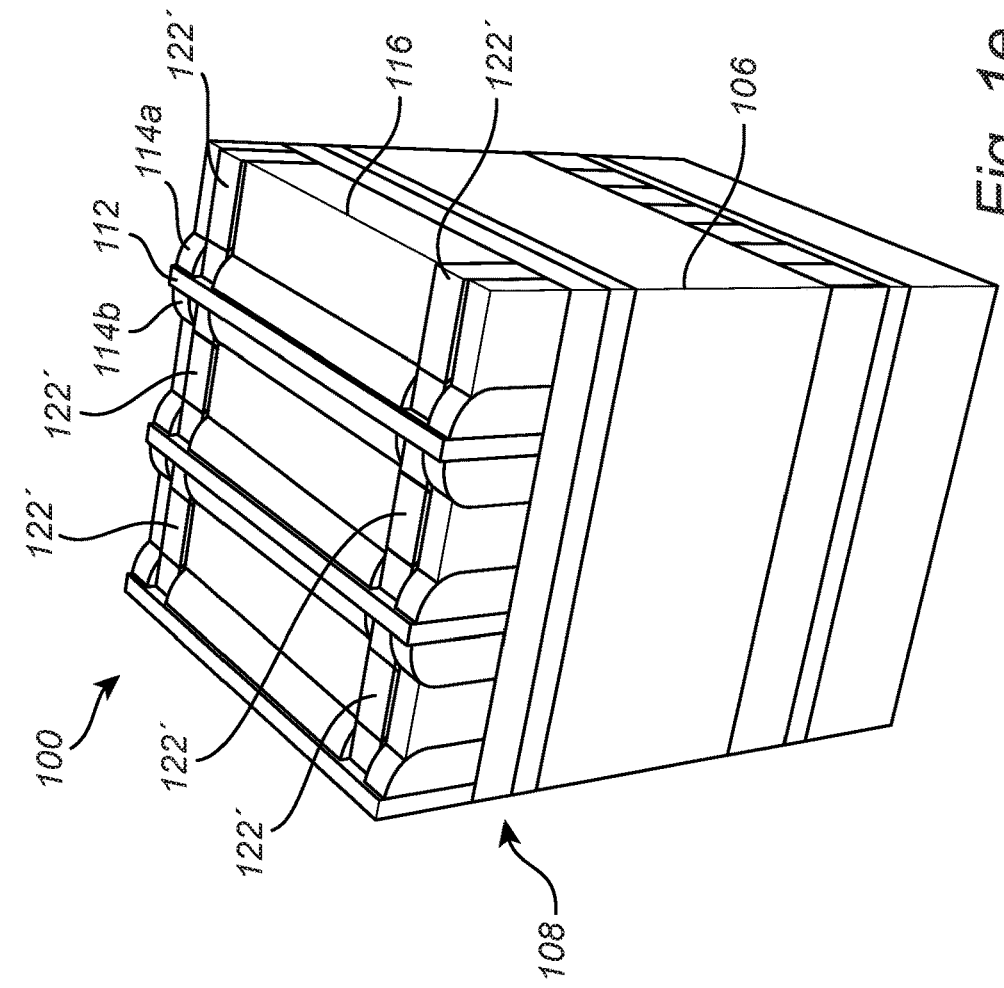

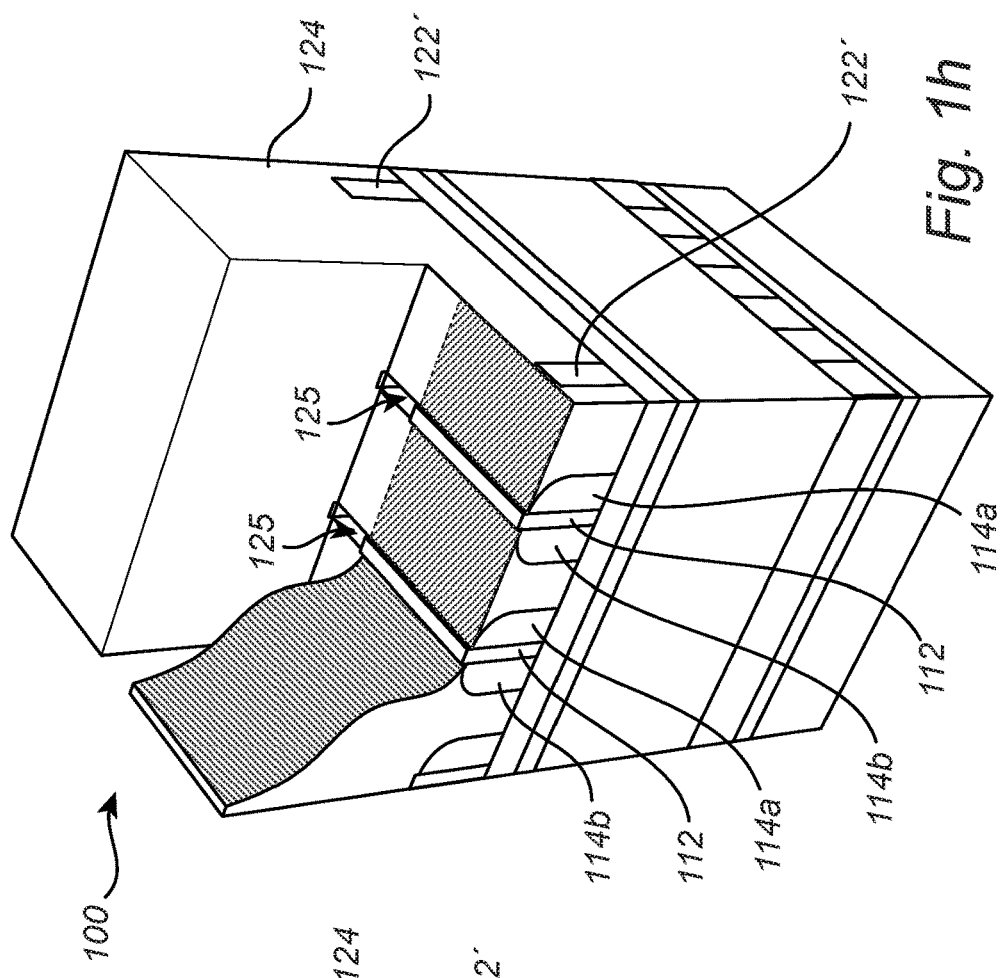
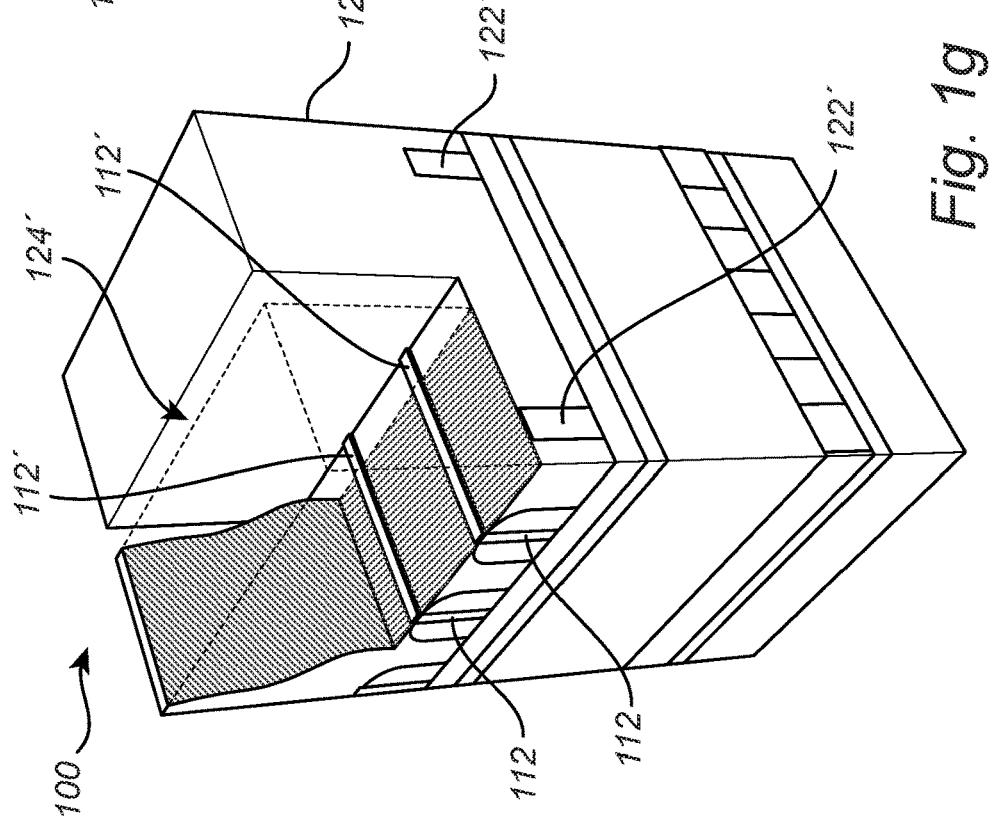

METHOD FOR DEFINING PATTERNS FOR CONDUCTIVE PATHS IN A DIELECTRIC LAYER

CROSS-REFERENCE TO RELATED APPLICATIONS

The present application is a non-provisional patent application claiming priority to European Patent Application No. EP 17158033.5, filed Feb. 27, 2017, the contents of which are hereby incorporated by reference.

FIELD OF THE DISCLOSURE

The present disclosure relates to a method for defining patterns for conductive paths in a dielectric layer.

BACKGROUND

Modern circuit fabrication typically includes processes of forming electrical interconnection structures for interconnecting semiconductor devices in a functioning circuit. An interconnection structure may include one or more metallization levels or tiers, which are formed above the substrate and the semiconductor devices. A metallization level includes conductive paths or lines arranged in a dielectric material layer. The dielectric material layer of a metallization level may isolate the conductive paths of the metallization level from a higher and/or a lower metallization level. Conductive paths of different metallization levels may be interconnected by conductive vias extending through the dielectric layers.

A metallization level may be formed by forming patterns including trenches and holes in a dielectric layer, and filling the trenches and holes with a conductive material. Such a process may be referred to as a dual damascene process. The process may be repeated to form a stack of metallization levels on top of each other.

Patterns may be formed in a mask layer arranged above the dielectric layer using lithographic techniques and etching. Multiple patterning techniques like (litho-etch)x, or pitch splitting techniques such as self-aligned double patterning (SADP) or quadruple patterning (SAQP), may be used to enable patterns with sub-lithographic critical dimensions. Multiple patterning may be combined with block techniques to enable forming of interrupted or discontinuous lines.

SUMMARY

The present disclosure may provide an improved method for defining patterns for conductive paths in a dielectric layer. According to an aspect of the disclosure there is provided a method for defining patterns for conductive paths in a dielectric layer, the method comprising (a) forming a mask layer on the dielectric layer, (b) forming on the mask layer a set of longitudinally and parallel extending mask features, each mask feature including a mandrel having a pair of side wall spacers, the mask features being spaced apart such that gaps are formed between the mask features, (c) depositing an organic spin-on layer covering the set of mask features and filling the gaps, (d) etching a first trench in the organic spin-on layer, the first trench extending across at least a subset of the gaps and exposing the mask layer, (e) depositing in a spin-on process a planarization layer covering the organic spin-on layer and filling the first trench, (f) reducing a thickness of the planarization layer and the organic spin-on layer by etching until upper surfaces of the mask features are exposed, thereby forming, of remaining material of the planarization layer, a discrete first block mask in each gap of the subset of gaps, (g) removing remaining organic spin-on material between the mask features, selectively to each first block mask, thereby exposing the mask layer in the gaps between the mask features, and (h) etching the mask layer in the gaps, thereby forming a first set of trenches in the mask layer, at least one of the trenches being interrupted in a longitudinal direction.

The method enables definition, in a mask layer, of patterns for conductive paths or conductive lines in a dielectric layer of a metallization level. The patterns may be formed as trenches in the mask layer and subsequently transferred into the dielectric layer.

The position and dimension of the trenches may be established by the set of mask features. Mask features including mandrels having pairs of side wall spacers may be formed by techniques (such as multi patterning techniques) enabling sub-lithographic feature sizes.

Each first block mask enables forming of a discontinuous or interrupted trench, each discontinuous trench including a first and a second trench portion on opposite sides of a first block mask. Conductive lines with a tip-to-tip configuration may thereby be formed in the dielectric layer.

By forming the first block mask using the first trench in the organic spin-on layer, the first block mask may be formed in a self-aligned manner with respect to the gaps between the mask features. The presence of the mandrels will counteract forming of a block mask at a non-intended position between a pair of side-wall spacers of a mandrel. The dimensional and alignment requirements during the forming of the first block mask may thereby be relaxed.

The deposition of an organic spin-on layer may provide several benefits. For example, covering the set of mask features and filling the gaps with an organic spin-on layer may enable efficient definition of the positions of the first block mask. An organic spin-on layer may be deposited relatively quickly and in a self-planarizing manner. This obviates any need for a separate planarization step (e.g. by chemical mechanical polishing, CMP) prior to forming the first trench. An organic spin-on layer may also provide a comparably strong etch contrast with respect to materials typically used for mandrels and side wall spacers. This provides selective removal of the organic spin-on layer with respect to the side wall spacers and the mandrels. An organic spin-on layer is also possible to etch using non-Chloride based etching chemistries.

Forming the planarization layer by a non-metal based material (such as a silicon-including spin-on material) hence provides Chloride-based etching chemistries to be avoided for the purpose of defining the patterns. This enables a reduced cost process.

The deposition of a planarization layer in a spin-on process may provide several benefits. For example, spin-on deposition processes are comparably time efficient processes compared to other deposition processes such as chemical vapor deposition (CVD) and atomic layer deposition (ALD). Spin-on deposition also enables the trench to be filled comparably quickly with the material of the planarization layer. Moreover, as the planarization layer is deposited in a spin-on process, the planarization layer may be deposited in a self-planarizing manner. Hence, the thickness reduction for exposing mask features may be achieved by etch back, without a preceding CMP step. The deposition of a planarization layer in a spin-on process hence contributes to an overall efficiency of the process.

Since the material forming the planarization layer is directly deposited in the gaps at the intended positions (as defined by the position of the first trench) no separate patterning and etching of the planarization layer is required. Consequently, it is not required that the material forming the planarization layer provides an etch contrast compared to the material forming the side wall spacers. This provides flexibility in the selection of materials.

During the etching of the mask layer in the gaps between the mask features, the side wall spacers and each first block mask may act as a combined etch mask.

Generally, the set of mandrels may be formed by a first material, the side wall spacers may be formed by a second material and the mask layer may be formed by a third material, wherein the first, the second and the third material are different materials. The first material may be etched selectively from the second material. The third material may be etched selectively from the first and the second material. The first material may be etched selectively from the organic spin-on layer. The first material may be etched selectively from the planarization layer. The third material may be etched selectively from the third material. The organic spin-on layer and the planarization layer may be formed of different materials. The organic spin-on layer may be etched selectively from the planarization layer. In this context, a material "A" which may be etched selectively from a material "B" means that material A may be etched at a substantially greater rate than material B, in a given etch process. In other words, a feature of material A arranged adjacent to a feature of material B may be removed in an etch process without appreciably affecting the feature of material B.

The organic spin-on layer is formed by a spin-on-carbon layer.

The planarization layer may be formed by a silicon-including spin-on material. The planarization layer may be formed by a silicon-including spin-on material, for instance spin-on SiOx or spin-on SiOC. The mandrels may include amorphous silicon (a-Si), strained a-Si, or silicon nitride. The side wall spacers may include silicon oxide or silicon nitride.

The mask layer may be formed on the dielectric layer. The mask layer may be formed directly on the dielectric layer or with one or more intermediate layers between the dielectric layer and the hard mask layer.

The mask layer may be any layer or layer stack having the ability to withstand, and accordingly remain following, the removal of the metal oxide planarization layer. The mask layer may for instance be a non-resist based mask layer. The mask layer may be a "hard" mask layer. The mask layer may include titanium nitride, titanium oxide, hafnium oxide or zirconium oxide.

The mask layer may include a stack of a first material layer and a second material layer. The second material layer may be a buffer layer for facilitating forming of the set of mandrels above the first material layer. The second material layer may improve the overall etch stopping strength of the mask layer during the etch steps preceding the pattern transfer into the mask layer.

The first material layer may include titanium nitride, titanium oxide, hafnium oxide or zirconium oxide and the second material layer may include silicon nitride or silicon oxide. A silicon nitride layer may facilitate forming of amorphous silicon mandrels on the mask layer. A silicon oxide layer may facilitate forming of silicon nitride mandrels on the mask layer.

The mandrels of the set of mask features may interchangeably be referred to as cores or mandrel lines. The mandrels may extend in parallel to each other. The side wall spacers may be referred to as spacer lines. Each mask feature may accordingly include a mandrel line arranged in between a pair of spacer lines.

The set of mask features may be formed using a multiple patterning process such as SADP or SAQP.

By a first feature such as a layer, a level or other structure, being formed "above" a second feature such as a layer, a level or other structure, is hereby meant that the first feature is formed above the second feature (as seen) in a normal direction to the main surface or in-plane extension of the feature, e.g. layer or level, or equivalently in the normal direction to a substrate on which the metallization level is to be formed.

By a first feature such as a layer, a level or other structure, being formed "on" a second feature such as a layer, a level or other structure, is hereby meant that the first feature is formed directly on the second feature, i.e. in abutment with the second feature, or with one or more layers intermediate the first and the second feature, i.e. not in direct contact with the second feature.

By "metallization level" is hereby meant a structure including conductive paths arranged in a dielectric material layer. The method may be repeatedly performed for definition, in a mask layer, of patterns for conductive paths or conductive lines in a dielectric layer of two or more metallization levels to form a stack of metallization levels.

By a "trench" in a layer (e.g. in the mask layer or in the dielectric layer) is hereby meant a recess in the layer. A trench may, at least along a portion thereof, extend in a straight line and presents a uniform width.

According to one embodiment the method further comprises, subsequent to reducing the thickness of the planarization layer and the organic spin-on layer: (a) depositing an organic spin-on layer covering the set of mask features and each first block mask, (b) etching a second trench in the organic spin-on layer, the second trench extending across and exposing at least a subset of the mandrels, and further etching each mandrel of the at least a subset of mandrels in the second trench, selective to the organic spin-on layer, to expose the mask layer, (c) depositing in a spin-on process a planarization layer covering the organic spin-on layer and filling the second trench, (d) reducing a thickness of the planarization layer and the organic spin-on layer by etching until upper surfaces of the mask features are exposed, thereby forming, of remaining material of the planarization layer, a discrete second block mask along each mandrel of the at least a subset of mandrels, (e) removing the set of mandrels, selectively to each second block mask, thereby exposing the mask layer between each pair of side wall spacers, and (f) etching the mask layer between each pair of side wall spacers, wherein each second block mask act as an etch mask, thereby forming a second set of trenches in the mask layer, at least one of the trenches being interrupted in a longitudinal direction.

The use of an organic spin-on layer and planarization layer in the present embodiment provides benefits corresponding to those discussed in connection with the main method aspect above. The various types of materials for the organic spin-on layer and the planarization layer discussed in connection with the main method aspect above applies correspondingly to this embodiment.

The present embodiment enables a doubled line density in that the first set of trenches may be formed by etching in the gaps between the mask features and in that the second set of trenches may be formed between the pairs of side wall spacers.

Each second block mask enables a trench of the second set of trenches to be formed as a discontinuous or interrupted trench, each discontinuous trench including a first and a second trench portion on opposite sides of a second block mask. Conductive lines with a tip-to-tip configuration may thereby be formed in the dielectric layer, also at positions defined by the second set of trenches.

By forming the second block mask using the second trench, the second block mask may be formed in a self-aligned manner with respect to a pair of side wall spacers. By etching each mandrel exposed in the second trench, selective to the organic spin-on layer, between a pair of side wall spacers, the presence of remaining material of the organic spin-on layer between mask features will counteract forming of a second block mask at a non-intended position between mask features. The dimensional and alignment requirements during the forming of the second block mask may thereby be relaxed.

The first and second set of trenches in the mask layer may be etched simultaneously, i.e. in a same etching process. In other words, etching the mask layer may include etching the mask layer in the gaps and between each pair of side wall spacers, wherein the side wall spacers, each first block mask and each second block mask act as a combined etch mask, the etching thereby forming a first set of trenches and a second set of trenches in the mask layer, at least one of the first set of trenches and at least one of the second trenches being interrupted in a longitudinal direction. The total number of etching steps for forming a pattern in the mask layer may thereby be limited.

The act of removing remaining organic spin-on material between the mask features may be performed subsequent to forming the one or more second block mask. Thereby, material portions of the first deposited (first) organic spin-on layer remaining in the gaps between the mask features may be re-used during the forming of the second block mask(s). The number of etch steps to which the side wall spacers and the mask layer are exposed may thereby be limited.

According to one embodiment the method further comprises: transferring the trenches in the mask layer (i.e. the first set of trenches and, as the case may be, also the second set of trenches) into the dielectric layer. The remaining portions of the mask layer (possibly together with any side wall spacers and first and second block masks remaining on the mask layer) may act as an etch mask, counteracting etching of regions of the dielectric layer covered by the remaining portions of the mask layer.

The method may further comprise filling the trenches in the dielectric layer with a conductive material.

The trenches may be at least partially filled with a conductive material. The conductive material may be a single metal or a mixture or alloy of a metal and another material. A complete filling of the trenches may allow the entire cross-sectional area, allowed by the trenches in the dielectric layer, to be filled by the conductive material to obtain a low-resistance interconnect structure.

The act of filing with a conductive material may comprise forming the conductive material also above the dielectric layer and removing the conductive material in locations outside of the trenches of the dielectric layer and the deepened first and second holes. The removing of excess conductive material may divide the deposited conductor into separate paths extending within the trenches of the dielectric layer.

BRIEF DESCRIPTION OF THE FIGURES

The above, as well as additional, features will be better understood through the following illustrative and non-limiting detailed description of example embodiments, with reference to the appended drawings.

FIGS. 1a-1m schematically illustrate a method for defining patterns for conductive paths in a dielectric layer, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A method for defining patterns for conductive paths in a dielectric layer will now be described with reference to FIGS. 1a-m.

Figure 1A:
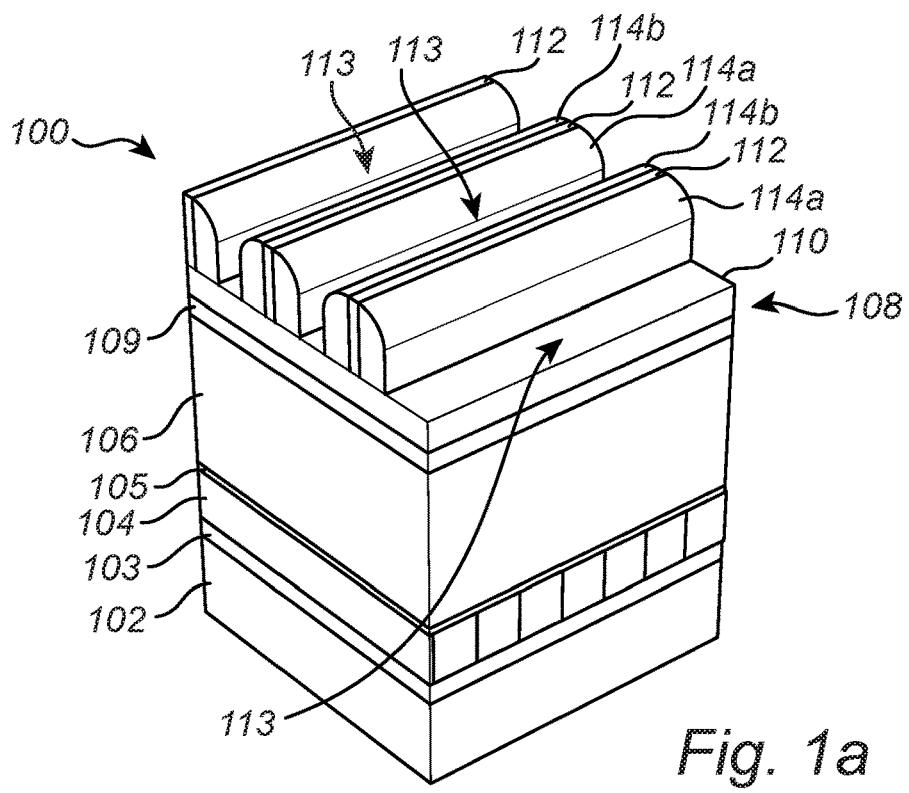

FIG. 1a shows, in perspective, a section of a semiconductor structure or intermediate device 100. The structure 100 may extend laterally or horizontally beyond the illustrated section. The illustrated planes of section extending through the structure 100 are common to all the FIGURES.

It is noted that the relative dimensions of the shown elements, in particular the relative thickness of the layers, is merely schematic and may differ from practice for the purpose of illustrational clarity.

The structure 100 includes in a bottom-up direction a semiconductor substrate 102. An active device layer 103 including semiconductor devices such as transistors are fabricated on a main surface of the substrate 102. The active device layer 103 may also be referred to as a front-end-of-line portion (FEOL-portion 103). In FIG. 1a, a first metallization level 104, including conductive lines arranged in a dielectric layer, is formed above the FEOL-portion 103. A base layer 105 is formed on the first metallization level 104. The base layer 105 may include a SiCN layer.

The structure 100 includes a dielectric layer 106. The dielectric layer 106 forms a dielectric layer of the metallization level which is to be formed. The dielectric layer 106 may include a silicon oxide layer, for instance $SiO_2$, or another low-K dielectric material. Although not shown in FIG. 1a, the dielectric layer 106 may include a stack of layers of different dielectric materials, such as an interface layer and/or an oxide capping layer.

A mask layer 108 is formed on the dielectric layer 106. The mask layer 108 covers an upper surface of the dielectric layer 106. The mask layer 108 may form a hard mask layer. The mask layer 108 may include a single layer of for instance titanium nitride, titanium oxide, hafnium oxide or zirconium oxide. The mask layer 108 may alternatively, as shown in FIG. 1a, include a stack of a first material layer 109 and a second material layer 110 arranged on the first material layer 108. The mask layer 108 may include a stack of a layer of titanium nitride, titanium oxide, hafnium oxide or zirconium oxide and a layer of silicon nitride or silicon oxide, for instance $SiO_2$. The mask layer 108, or the sub-layers 109, 110 thereof, may be formed by atomic layer deposition (ALD).

A set of mask features are formed on the mask layer 108, each mask feature including a mandrel 112 and a pair of side wall spacers 114a, 114b. FIG. 1a shows three mask features, however this is merely an illustrational example and typically a greater number of mandrels may be formed above the mask layer 108. The mandrels 112 form elongated structures, or lines, extending in parallel to each other.

Each mandrel 112 is provided with a respective pair of side wall spacers 114a, 114b. Each pair of side wall spacers 114a, 114b is formed by a first side wall spacer 114a, formed on a first side wall surface of a mandrel 112, and a second side wall spacer 114b, formed on a second side wall surface of the mandrel 112. The first and second side wall surfaces are opposite side wall surfaces of the mandrel 112.

The mask features are spaced apart such that longitudinally extending gaps 113 or spaces are formed between adjacent mask features. Each gap 113 is formed between a first side wall spacer 114a on a first mandrel 112 and a second side wall spacer 114b on a second mandrel 112, next or adjacent to the first mandrel.

Each gap 113 defines the position of a trench of a first set of trenches which are to be formed in the mask layer 108. Each mandrel 112 defines the position of a second set of trenches which are to be formed in the mask layer 108.

The mandrels 112 with the side wall spacers 114a, 114b may be formed using multiple patterning techniques:

According to an SADP-process, a mandrel layer may be formed on the mask layer 108. The mandrel layer may be formed by an a-Si layer, such as a strained a-Si layer. Alternatively, the mandrel layer may be formed by a SiN layer. The mandrel layer may be deposited by ALD, or by physical vapor deposition (PVD) or some other conventional thermal deposition process.

A resist-based mask layer (not shown in FIG. 1a) may be deposited on the mandrel layer. The resist-based mask layer may be deposited in a spin-coating process. A pattern for defining the mandrels 112 may be formed in the resist-based mask layer using single- or multiple exposure lithography. The pattern of the resist-based mask layer may be transferred into the mandrel layer by etching, thereby forming the mandrels 112. The mandrels 112 may thereafter be covered by a conformal spacer material layer. The spacer material layer may for instance be of silicon oxide, such as $SiO_2$, or of SiN. The spacer material layer may be deposited in an ALD process. Physically separated side wall spacers 114a, 114b may be formed by anisotropically etching the spacer material layer such that the spacer material layer remains only on the sidewalls of the mandrels 112.

According to a SAQP-process two mandrel layers may be used, a top and a bottom mandrel layer. A first set of mandrels may be formed in the top mandrel layer in similar manner as in the SADP-process. A first set of side wall spacers may be formed on the first set of mandrels in similar manner as in the SADP-process. The first set of mandrels may thereafter be removed selectively from the first set of side wall spacers by etching. The bottom mandrel layer may thereafter be etched using the first set of spacers as an etch mask, wherein the pattern defined by the first set of spacers may be transferred to the bottom mandrel layer, thereby forming the set of mandrels 112 shown in FIG. 1a. The side wall spacers 114a, 114b may thereafter be formed in a corresponding manner as the first set of side wall spacers, following removal of remaining portions of the top mandrel layer.

The first set of mandrels may in principle also be produced by a line doubling process such as the above-described SAQP-process. Although there is in principle no limit in the number of line doubling processes that can be used, each doubling process however becomes more technically challenging. Hence, in practice a limit, dependent inter alia on accuracy of equipment and control of process conditions does exist.

Figure 1B:
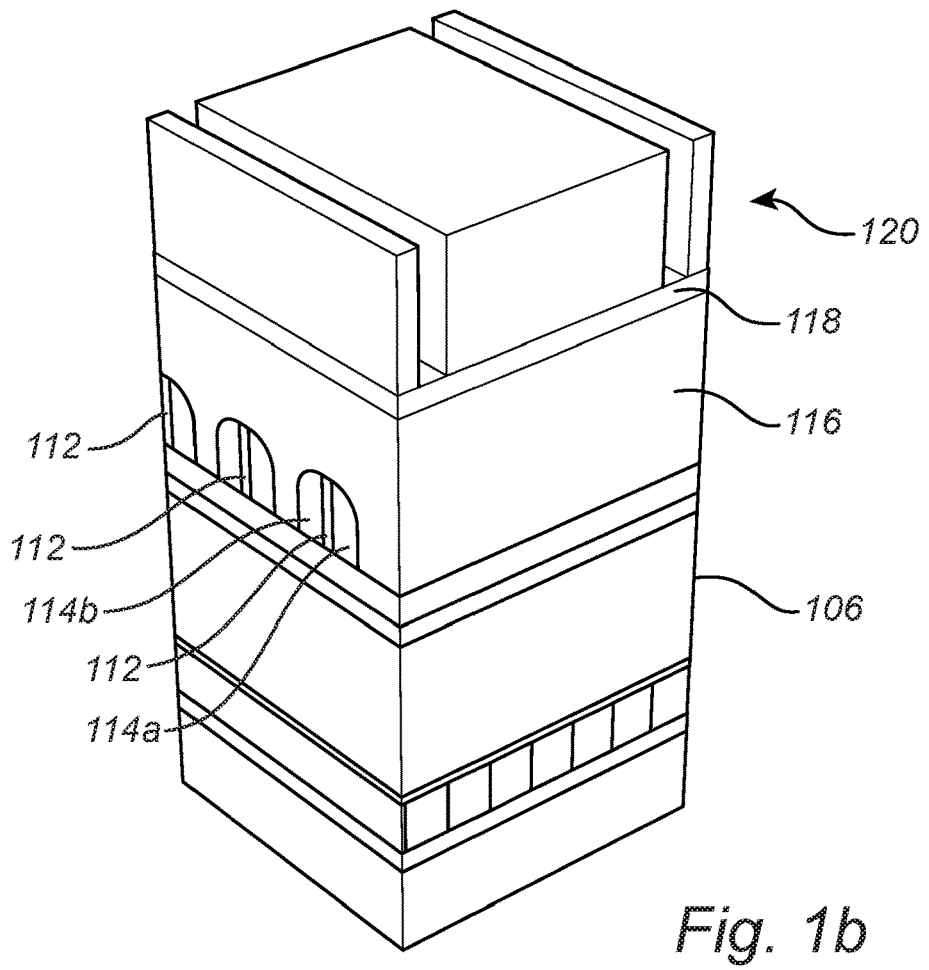

In FIG. 1b, an organic spin-on layer 116 has been formed to cover the set of mandrels 112 and the side wall spacers 114a, 114b. The organic spin-on 116 fills the gaps 113 between the mask features. The organic spin-on layer 116 may be formed by a spin-on-carbon (SOC) layer or some other organic spin-on layer which is free from silicon.

A patterned resist-based mask layer 120 is formed on the organic spin-on layer 116. The mask layer 120 is patterned to include at least one trench, extending in a direction transverse to the longitudinal direction of the mask features.

As shown in FIG. 1b, an intermediate layer 118 may be arranged between the organic spin-on layer 116 and the mask layer 120. The intermediate layer 118 may include a spin-on-glass layer (SOG), a thin layer of $SiO_2$, a-Si, SiON or SiOC. An intermediate layer 118 may be used for improving the fidelity of a transfer of the pattern of the patterned resist-based mask layer 120 into the organic spin-on layer 116.

In FIG. 1c the pattern defined by the patterned resist-based mask layer 120 has been transferred into the organic spin-on layer 116 by etching while using the mask layer 120 as an etch mask. The layer 116 may be etched using a fluorine-based etch chemistry. The mask layer 120 may thereafter be stripped, optionally along with the intermediate layer 118, if present. At least one first trench 116' has accordingly been formed in the organic spin-on layer 116. The first trench 116' extends across the gaps 113 and exposes an upper surface of the mask layer 108 within the gaps 113. In FIG. 1c, a portion of the layer 116 has been cut-out to allow viewing inside the trench 116'.

FIGS. 1b and 1c illustrate forming of two trenches 116'. However this merely represents an example and fewer or more trenches 116' may be formed in a corresponding manner, to form a desired number of trench interruptions. Also, FIGS. 1b and 1c illustrate forming of a trench 116' extending across at least three mandrels 112. However, this merely represents an example and the trench 116' may be formed to extend across only one, only two or more than three mandrels 112.

In FIG. 1d the structure 100 has been covered with a planarization layer 122. The planarization layer 122 planarizes the structure 100. The planarization layer 122 covers the organic spin-on layer 116 and fills the trenches 116'. The planarization layer 122 further fills the portions of the gaps 113 extending inside the trenches 116'.

The planarization layer 122 is deposited in a spin-on process. The planarization layer 122 may be formed by a silicon-including spin-on material, for instance a silicon oxide-including spin-on material, e.g. SiOx or SiOC. The material which is to form the final planarization layer 122 may be dissolved in a solvent. The solvent may be evaporated during and/or subsequent to forming a thin film by spinning the structure 100, wherein the previously dissolved material may remain on the structure 100 to form the planarization layer 122.

In FIG. 1e the thickness of the planarization layer 122 has been reduced to expose an upper surface of the mask features including the mandrels 112. As shown, portions of the side wall spacers 114a, 114b previously covered by the organic spin-on layer 116 may also be exposed.

As shown, remaining material of the planarization layer 122 form discrete first block masks 122' in each gap of the gaps 113 which were exposed during the forming of the trenches 116'. Portions of the organic spin-on layer 116 remaining in the gap are arranged on opposite sides of each first block mask 122'.

Owing to the self-planarizing property of the planarization layer 124, the thickness reduction may be achieved by an etch-back process, without requiring a preceding planarization step (e.g. by CMP). The etch back of the planarization layer 122 may include a dry etch process. A fluorine-based etching chemistry may be used. The etch-back may be performed until the upper surface of the mandrels 112 is exposed.

As illustrated in FIG. 1e, the etch-back process may, if the etch contrast between the material of the side wall spacers 114a, 114b and the material of the planarization layer 122 not is very strong, result in a slight etch back of also the side wall spacers 114a, 114b.

With reference to FIG. 1f, subsequent to reducing the thickness of the planarization layer 122 and the organic spin-on layer 116, a further spin-on deposition of an organic spin-on material is performed to cover the structure 100. The further deposited organic spin-on material may be of a same material as the organic spin-on layer 116.

In the thickness reduction process illustrated in FIG. 1e, portions of the (first) organic spin-on layer 116 were left remaining in the gaps 113. Accordingly, the further deposited organic spin-on material may cover also the remaining portions of the organic spin-on layer 116. Alternatively, the organic spin-on layer 116 may subsequent to the thickness reduction process illustrated in FIG. 1e be completely removed in the gaps 113. Accordingly, the further deposited organic spin-on material may fill the gaps 113 between the mask features. In either case, the organic spin-on layer present in the structure 100 in FIG. 1f, whether deposited in a single or in two different deposition processes, will be referred to as the organic spin-on layer 124.

A patterned resist-based mask layer 128 is formed on the organic spin-on layer 116. The mask layer 128 is patterned to include at least one trench, extending in a direction transverse to the longitudinal direction of the mask features.

An intermediate layer 126, corresponding to the intermediate layer 118, may be arranged between the organic spin-on layer 124 and the mask layer 128 for improving the fidelity of a transfer of the pattern of the patterned resist-based mask layer 126 into the organic spin-on layer 124.

In FIG. 1g the pattern defined by the patterned resist-based mask layer 128 has been transferred into the organic spin-on layer 124. The mask layer 128 may thereafter be stripped, optionally along with the intermediate layer 126, if present. At least one second trench 124' has accordingly been formed in the organic spin-on layer 124. The second trench 124' extends across and exposes the mandrels 112 of the mask features.

Further etching is thereafter performed, of the exposed upper surfaces of the mandrels 112 in the second trench 124', selective to the organic spin-on layer 124 and the side wall spacers 114a, 114b, until the mask layer 108 is exposed. The resulting structure is shown in FIG. 1h.

In FIGS. 1g and 1h, a portion of the layer 124 has been cut-out to allow viewing inside the trench 124'.

A first etching chemistry may be used during the forming of the second trench 124' in the organic spin-on layer 124. The first etching chemistry may be the same as for the etching of the first trenches 116'. A second etching chemistry may be used during the etching of the mandrels 112 to allow selective removal of the mandrel material, preserving organic spin-on material in the gaps between the mask features. The second etching chemistry may include a HBr based plasma. It is also possible to use a Chlorine-based second etching chemistry.

The selective etching of each mandrels 112 inside the trench 124' results in, at the position of each mandrel 112 exposed in the trench 124', a hole 125 extending to the mask layer 108. Each hole 125 extends between the pair of side wall spacers 114a, 114b of the respective mandrel 112. Each mandrel 112 is thus divided into two separate parts, on opposite sides of a respective hole 125.

Similar to the discussion of the trenches 116', the illustrated number of trenches 124' and their extension across at least three mandrels merely represent an example.

Figure 1I:
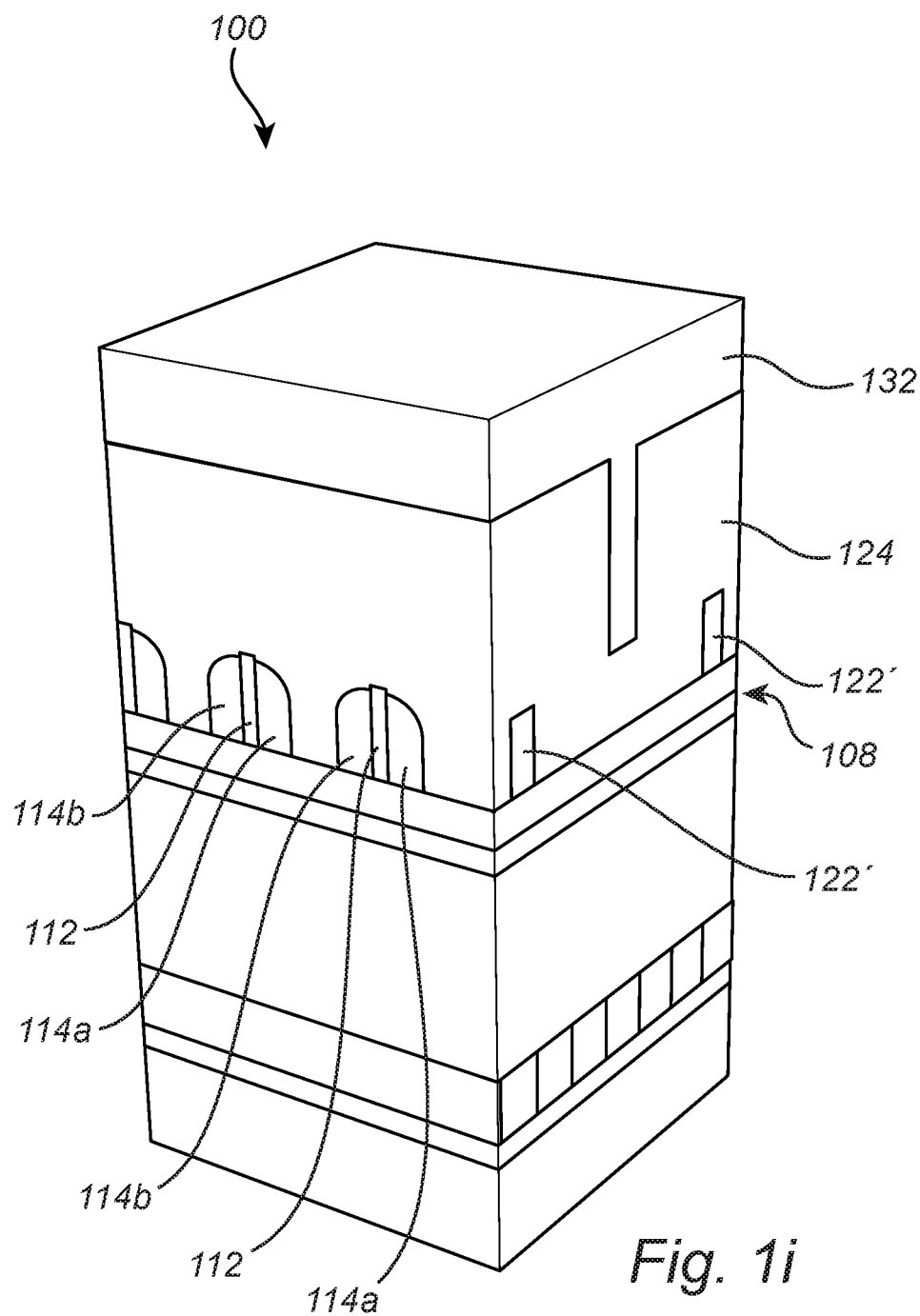

In FIG. 1i the structure 100 has been covered with a planarization layer 132. The planarization layer 132 planarizes the structure 100. The planarization layer 132 covers the organic spin-on layer 124 and fills the trench 124'. The planarization layer 132 further fills the holes along the mandrels 112. The planarization layer 132 may be of a same material and be deposited in a same manner as the planarization layer 122. The planarization layer 122 may be referred to as a first planarization layer 122 and the planarization layer 132 may be referred to as a second planarization layer 132.

Figure 1J:
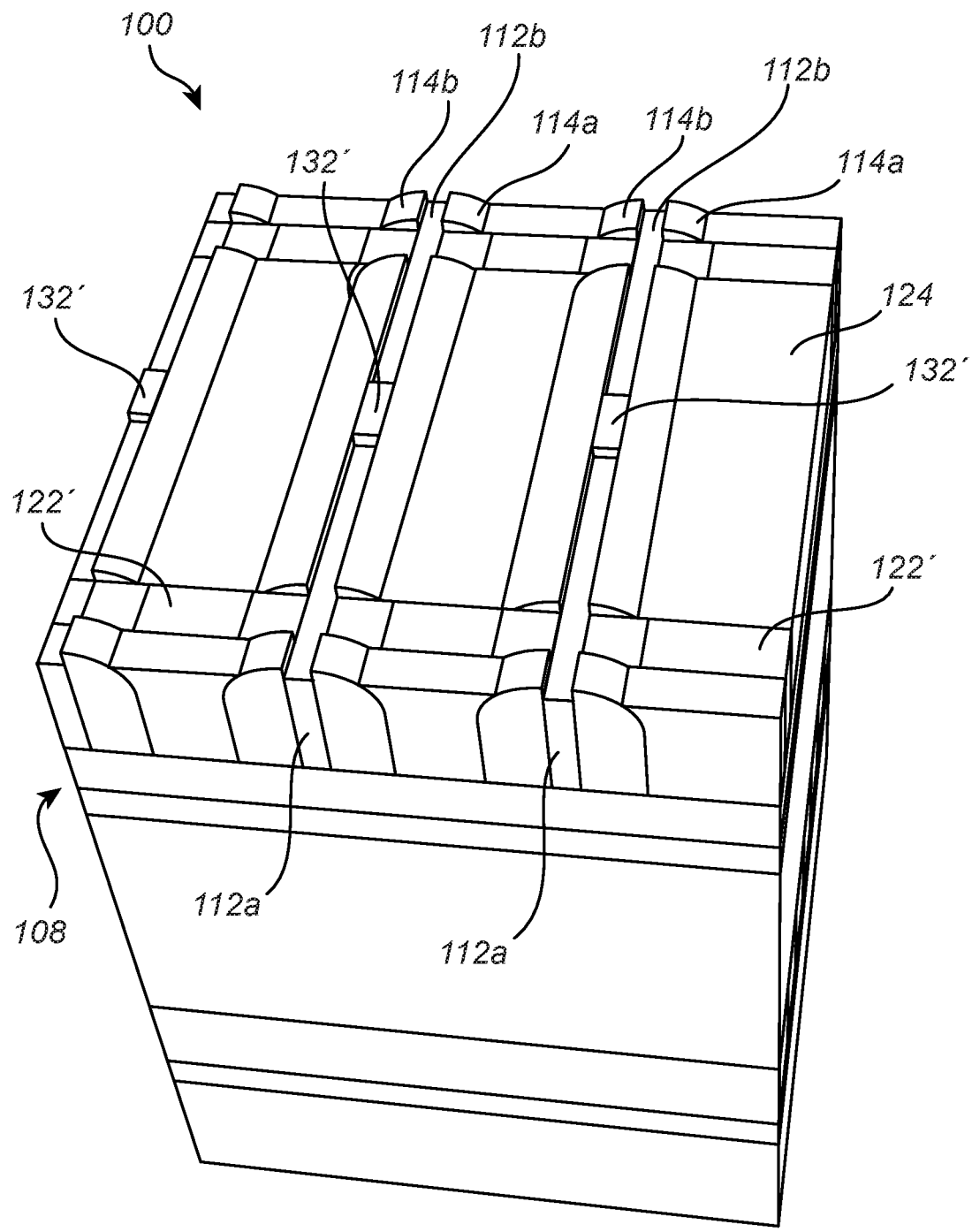

In FIG. 1j the thickness of the planarization layer 132 has been reduced to expose an upper surface of the mask features. The thickness reduction may be achieved by an etch back process as described in connection with FIG. 1e. As shown, remaining material of the planarization layer 132 form discrete second block masks 132' along each mandrel which were exposed during the forming of the trench 124'. Between each pair of side wall spacers 114a, 114b a first mandrel portion 112a and a second mandrel portion 112b are arranged, on opposite sides of a respective second block mask 132'.

Figure 1K:
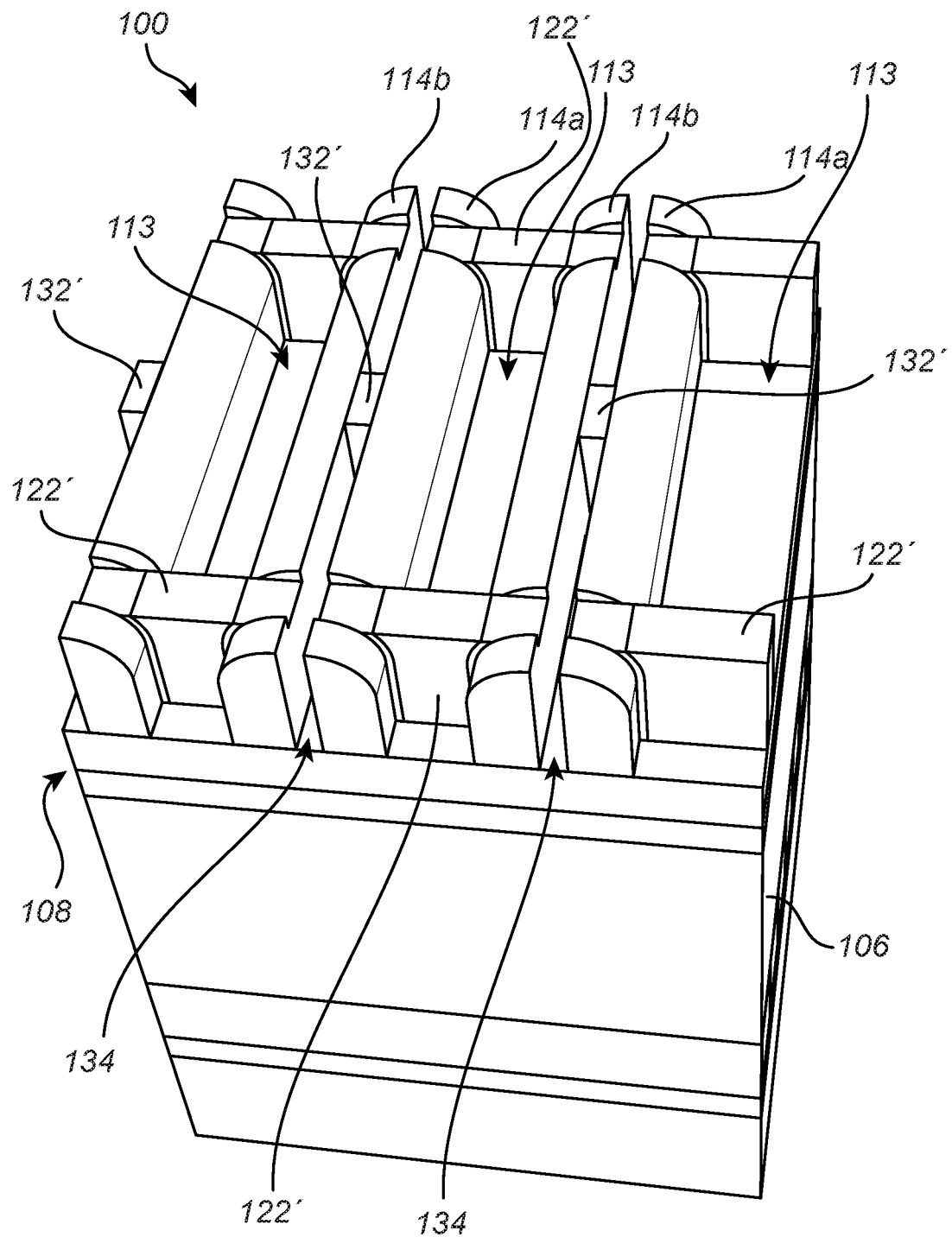
Figure 1I:
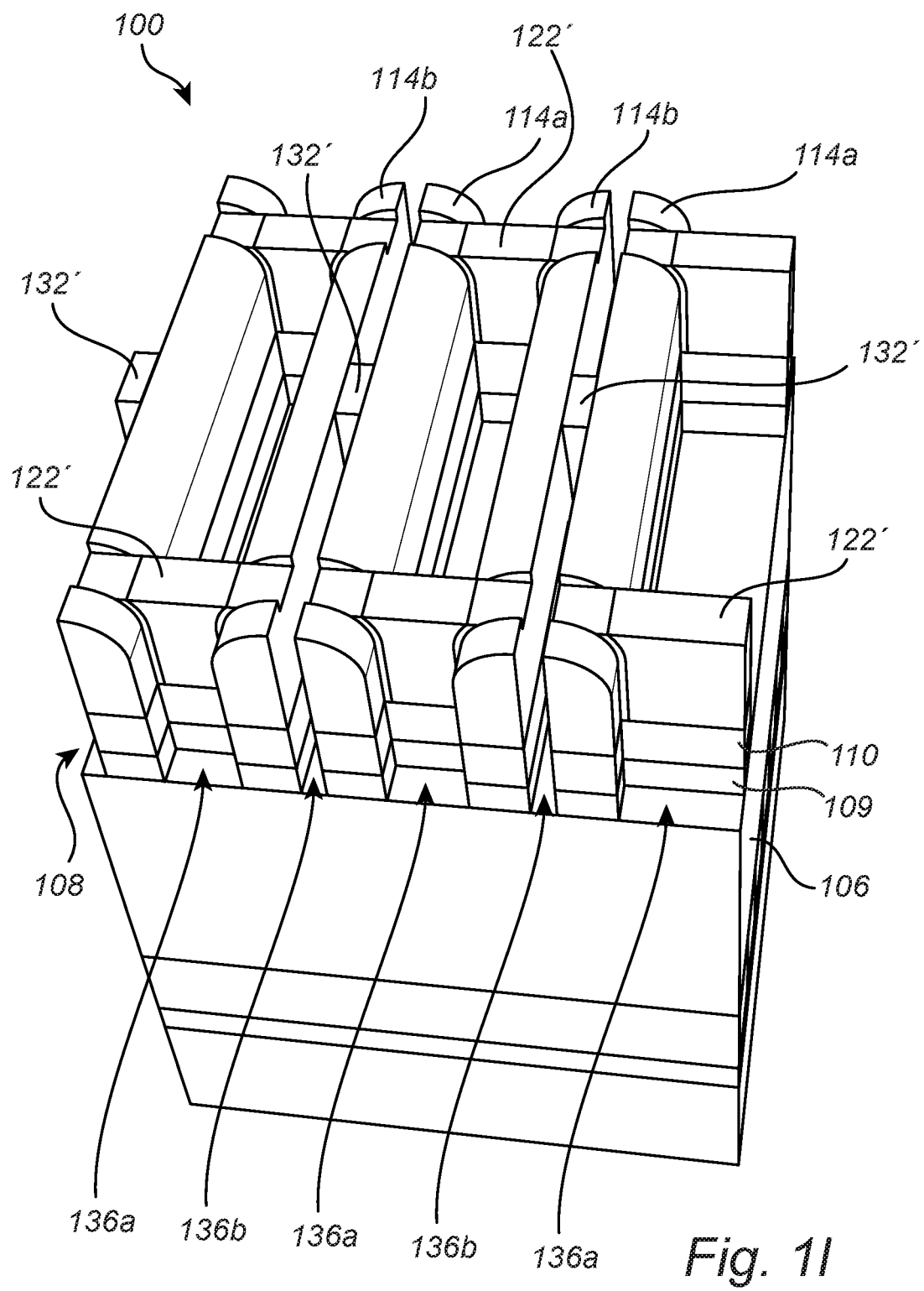

FIG. 1k, the mandrels 112 or mandrel portions 112a, 112b have been removed, selectively to the second block masks 132' and the side wall spacers 114a, 114b. Thus, longitudinal gaps 134 have been formed between the side wall spacers 114a, 114b, at each position previously occupied by a mandrel 112.

In FIG. 1k, material of the organic spin-on layer 124 remaining between the mask features has also been removed, selectively to the first block masks 122'. The mask layer 108 is hence exposed in the gaps 113 between the mask features. The organic spin-on layer 124 may be removed using an etch process including an oxygen-based or $H_2/N_2$-based etching chemistry.

The gaps 113 between mask features may be commonly referenced as a first set of gaps 113. The gaps 134 between each pair of side wall spacers 114a, 114b may be commonly referenced as a second set of gaps 134.

Each gap 113 is interrupted, in its longitudinal direction, by at least one first block mask 122'. Each gap 134 is interrupted, in its longitudinal direction, by at least one second block mask 132'.

In FIG. 1l, the mask layer 108 has been etched in the gaps 113 between the mask features, and in the gaps 134 between each pair of side wall spacers 114a, 114b. The mask layer 108 may be etched using any suitable dry etch process. For instance, a chlorine-based etch chemistry, possibly supplemented with additional gases such as $CH_4$ or HBr. In a dual layer mask layer 108 including a second layer 110 of SiN, an initial etch step with fluorine-based etching chemistry may be applied first to expose the first layer 109, which subsequently may be etched as stated above.

During the etching of the mask layer 108 the side wall spacers 114a, 114b, the first block masks 122' and the second block masks 132' act as a combined etch mask. A first set of trenches 136a and a second set of trenches 136b are accordingly formed in the mask layer 108. Due to the presence of the first block masks 122' and the second block masks 132' the trenches 136a, 136b are interrupted in their respective longitudinal directions by remaining portions of the mask layer 108, the portions being formed at positions defined by the positions of the first and second block masks 122', 132'. The positions of the first and second block masks 122', 132' hence define the tip-to-tip locations for the conductive paths that are to be formed in the dielectric layer 106.

Figure 1M:
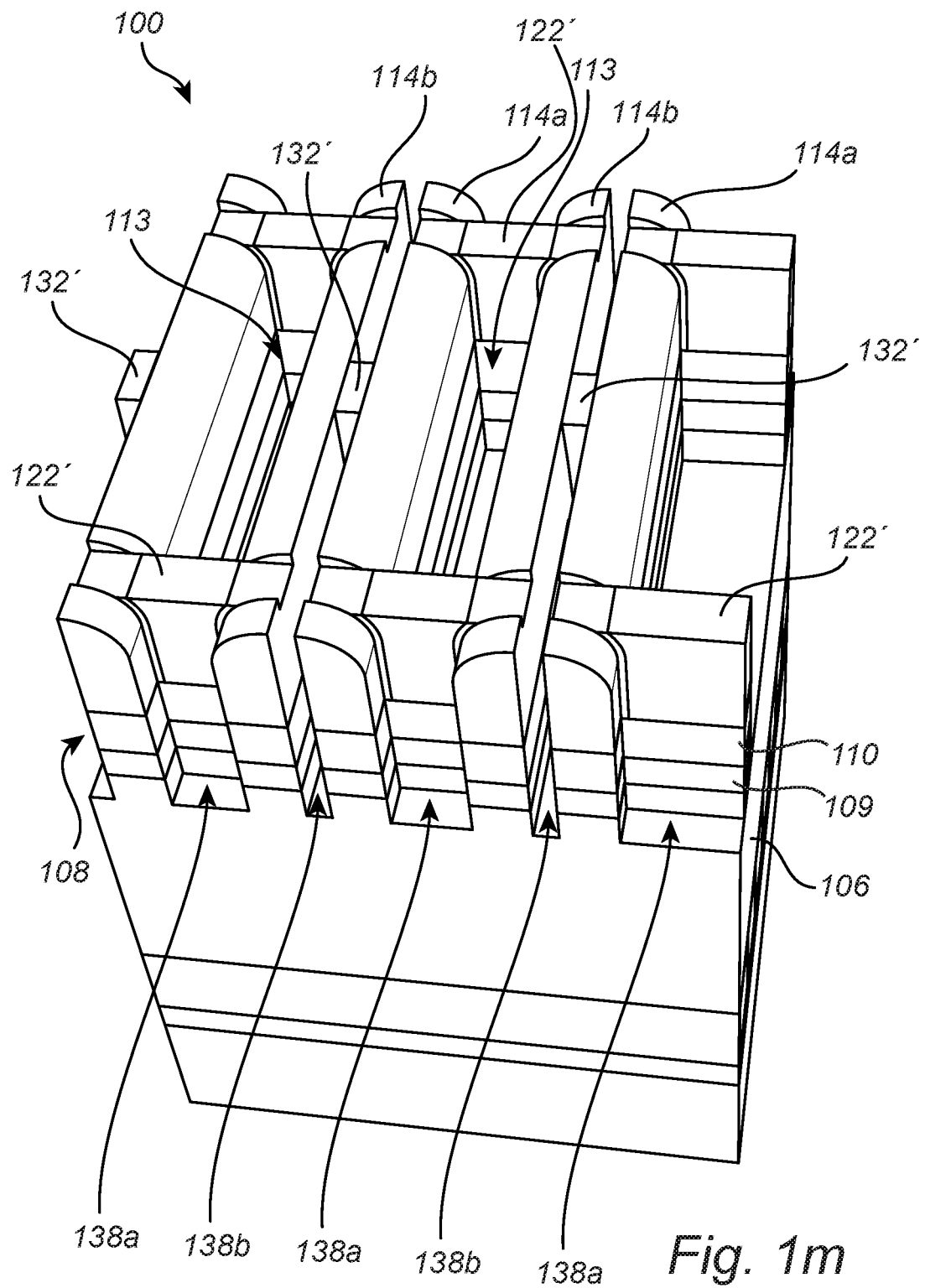

In FIG. 1m, the pattern of the mask layer 108 has been transferred into the dielectric layer 106. Trenches 138a corresponding to the trenches 136a, and trenches 138b corresponding to the trenches 136a are thereby formed in the dielectric layer 106. The pattern transfer may be performed by an anisotropic etch process. The etch process may be a plasma-based etching process. The etch process may be a reactive ion etching (RIE) process. For instance, F-based plasmas may be used for selectively etching a silicon oxide dielectric layer 106 with respect to the mask layer 108, including e.g. a layer of titanium nitride, titanium oxide, hafnium oxide or zirconium oxide.

In case the mask layer 108 includes sub-layers 109, 110 the sub-layer 110 may, in case it is formed by silicon oxide, be consumed during the etching of the dielectric layer 106. Moreover, during the pattern transfer also the side wall spacers 114a, 114b may be consumed.

Following the pattern transfer, the mask layer 108 (and the buffer layer 108) may be removed.

The trenches 138a, 138b in the dielectric layer 106 may subsequently be filled with a conductive material to form the conductive paths or lines of the metallization level. The conductive material may be a single metal such as Cu, Al or W, or alloys thereof.

The trenches 138a, 138b may be filled with a conductive material using an electro-plating process, or a deposition process such as CVD or ALD.

The conductive material may be formed to overfill the trenches 138a, 138b and thus cover surfaces of the dielectric layer 106 outside of the trenches 138a, 138b. Such excess material may subsequently be removed by planarization and/or etch back to form the final conductive paths.

The above method steps may be supplemented with conventional process techniques for via formation, in order to interconnect conducting paths of different metallization levels.

In the above, the disclosure has mainly been described with reference to a limited number of examples. However, as is readily appreciated by a person skilled in the art, other examples than the ones disclosed above are equally possible within the scope of the disclosure, as defined by the appended claims. For instance, although in the above a method has been disclosed in connection with forming of a second metallization level above an already formed first metallization level 104, the method may be applied also for forming a first metallization level, or third metallization levels or beyond. Moreover, in the above the mandrels 112 were removed prior to removing remaining material of the organic spin-on layer 124. The order of these process steps may however be reversed.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for defining patterns for conductive paths in a dielectric layer, the method comprising:
    forming a mask layer on the dielectric layer,
    forming on the mask layer a set of longitudinally and parallel extending mask features, each mask feature including mandrels having a pair of side wall spacers, the mask features being spaced apart such that gaps are formed between the mask features,
    depositing an organic spin-on layer covering the set of mask features and filling the gaps,
    etching a first trench in the organic spin-on layer, the first trench extending across at least a subset of the gaps and exposing the mask layer,
    depositing in a spin-on process a planarization layer covering the organic spin-on layer and filling the first trench,
    reducing a thickness of the planarization layer and the organic spin-on layer by etching until upper surfaces of the mask features are exposed, thereby forming, of remaining material of the planarization layer, a discrete first block mask in each gap of the subset of gaps,
    subsequent to reducing the thickness of the planarization layer and the organic spin-on layer:
        depositing an organic spin-on layer covering the set of mask features and each first block mask,
        etching a second trench in the organic spin-on layer, the second trench extending across and exposing at least a subset of mandrels, and further etching each mandrel of the at least a subset of mandrels in the second trench, selective to the organic spin-on layer, to expose the mask layer,
        depositing in a spin-on process a planarization layer covering the organic spin-on layer and filling the second trench,
        reducing a thickness of the planarization layer and the organic spin-on layer by etching until upper surfaces of the mask features are exposed, thereby forming, of remaining material of the planarization layer, a discrete second block mask along each mandrel of the at least a subset of mandrels,
        removing the subset of mandrels, selectively to each second block mask, thereby exposing the mask layer between each pair of side wall spacers, and
        etching the mask layer between each pair of side wall spacers, wherein each second block mask act as an etch mask, thereby forming a second set of trenches in the mask layer, at least one of the trenches being interrupted in a longitudinal direction, wherein a position of the discrete first block mask and a position of the discrete second block mask define intersections for a conductive material, removing remaining organic spin-on material between the mask features, selectively to each first block mask, thereby exposing the mask layer in the gaps between the mask features, etching the mask layer in the gaps, thereby forming a first set of trenches in the mask layer, at least one of the trenches being interrupted in a longitudinal direction;

transferring the trenches in the mask layer into the dielectric layer by etching the dielectric layer; and filling the trenches in the dielectric layer with the conductive material.

2. The method according to claim 1, wherein the first and second set of trenches in the mask layer are etched simultaneously.

3. The method according to claim 1, wherein removing the remaining organic spin-on material between the mask features is performed subsequent to forming the one or more second block mask.

4. The method according to claim 1, wherein the mandrels include amorphous silicon or silicon nitride.

5. The method according to claim 1, wherein the side wall spacers include silicon oxide or silicon nitride.

6. The method according to claim 1, wherein the planarization layer is formed by a silicon-including spin-on material.

7. The method according to claim 1, wherein the mask layer includes titanium nitride, titanium oxide, hafnium oxide or zirconium oxide.

8. The method according to claim 1, wherein the mask layer includes a stack of a first material layer and a second material layer.

9. The method according to claim 8, wherein the first material layer includes titanium nitride, titanium oxide, hafnium oxide or zirconium oxide and the second material layer includes silicon nitride or silicon oxide.

* * * * *